United States Patent [19]

Komly et al.

[11] Patent Number: 4,744,086

[45] Date of Patent: May 10, 1988

[54] PROCESS FOR THE TRANSMISSION IN BLOCKS OF DIGITAL INFORMATION WORDS WITH ERROR CORRECTION CAPABILITY

[75] Inventors: Alain Komly, Paris; Michel Maillard, Maintenon; Alain Viallevieille, Versailles; Alain Weisser, Clamart, all of France

[73] Assignee: Etablissement Public de Diffusion dit Telediffusion de France, France

[21] Appl. No.: 870,703

[22] Filed: Jun. 4, 1986

[30] Foreign Application Priority Data

Jun. 5, 1985 [FR] France ..................... 85 08481

[51] Int. Cl.$^4$ ........................................... G06F 11/10
[52] U.S. Cl. ........................................... 371/40; 371/38
[58] Field of Search ...................... 371/38, 39, 40

[56] References Cited

U.S. PATENT DOCUMENTS

| | | | |
|---|---|---|---|
| 3,439,331 | 4/1969 | Brown et al. | 371/38 |
| 4,336,612 | 6/1982 | Inoue et al. | 371/39 |
| 4,622,598 | 11/1986 | Doi et al. | 371/40 X |
| 4,641,309 | 2/1987 | Nakano et al. | 371/40 X |
| 4,646,170 | 2/1987 | Kobayashi et al. | 371/39 X |

FOREIGN PATENT DOCUMENTS

| | | |
|---|---|---|
| 0129224 | 6/1984 | European Pat. Off. |
| 2061575 | 10/1980 | United Kingdom . |
| 2140178 | 11/1984 | United Kingdom . |

OTHER PUBLICATIONS

Patel, Coding Scheme for Multiple Sections Error Correction, IBM Technical Disclosure Bulletin, vol. 17, No. 2, Jul. 1974, pp. 473-475.

Greer et al., 32-Bit EDAC Chips Fix Single-Bit Errors Efficiently, Electronic Design, vol. 31, No. 1, Jan. 1983, pp. 269-274.

Aria et al., High Capability Error Correcton LSI for CD Player and CD ROM, IEEE Transactions on Consumer Electronics, No. 3, Aug. 1984, pp. 358-359.

Parker, A Combined Error Correction and Channel Code Scheme for Digital Video Recorders, Journal of the Institution of Electronics and Radio Engineers, Great Britain, vol. 55, No. 4, Apr. 1985, pp. 139-144.

Yokoyama et al., An Experimental Digital Videotape Recorder, the British Kenematography Sound and Television Society Journal, vol. 62, No. 11, Nov. 1980, pp. 570-580.

Primary Examiner—Charles E. Atkinson
Attorney, Agent, or Firm—Cesari and McKenna

[57] ABSTRACT

The invention relates to a process for the transmission in blocks of digital information words with a correction capability. This process consists of transmitting in blocks digital information words, each information word having a length of $n_1$ bits, in which with each sequence of $n_2-k$ ($n_2 > k$) of consecutive information words are associated k redundancy words of $n_1$ bits each in which, for each order i ($1 < i < n_2$), the k bits of order i of the redundancy words are redundancy bits in accordance with a Hamming code ($n_20k$, k). For each set of $n_2$ linked words, each word is transmitted while being protected by an error detecting code. Several sets of linked words can be interlaced. The words of the same order or rank of each set form a group and the groups can be formed by frames.

15 Claims, 6 Drawing Sheets

PROCESS FOR THE TRANSMISSION IN BLOCKS OF DIGITAL INFORMATION WORDS WITH ERROR CORRECTION CAPABILITY

BACKGROUND OF THE INVENTION

The present invention relates to a process for the transmission in blocks of digital information words. It more particularly relates to a coding and decoding procedure in which transmission blocks are formed, each being constituted by a sequence of associated digital information words and redundancy words, the latter being able to detect and correct, on reception, long error bursts, such as those encountered in digital recording on magnetic tape.

In conventional manner, in the field of digital recording on magnetic tape, the information to be recorded is organized into frames, each consisting of a synchronization word, an identification word, one or more information words and an error detecting code, which may not detect all the errors.

In order to improve the error detecting and correcting capacities, it is known to regroup the frames into sets of frames and link the homologous informations (i.e. bits of the same order) of the frames of the same set by simple mathematical relations, such as the parity of the sum of the homologous bits. It is also known to form a transmission block by interlacing the sequences of frames of several linked sets, so as to make the probabilities of errors on the frames of the same set independent of one another.

The article Improved two channel PCM tape recorder for professional use by K. Tanaka et al presented at the 64th congress of the Association of Audio Engineers in November 1979 in New York describes such a block transmission process for digital information words. Recording takes place on an 8 track magnetic tape, 6 of these tracks being allocated to information words and two to redundancy words linking the homologous informations of the frames of the same set. These redundancy words are obtained with the aid of a code of the Reed-Solomon type.

This known process is not completely satisfactory because the Reed-solomon code is complex. The detection and correction of errors by means of this code consequently require long and complicated calculations. Moreover, the correction capacity of said process, i.e. the probability of having a non-correctable error is proportional to $p^3$ when the probability of having an error is equal to p. This correction capacity is not very high. The performance to complexity ratio is consequently mediocre.

Transmission processes are known in which the probability of a non-correctable error is proportional to $p^4$. Such a process is described in document FR-A-2 467510.

In this process, the information words are subdivided into a sequence of even information words and a sequence of uneven information words. These sequences are coded and transmitted with a time lag. This method makes it possible to ensure that a fault on the transmission channel or recording medium does not lead to an error on two consecutive information words. An information word recognized as being erroneous can consequently be corrected or, if the correction is not possible, interpolated as from the preceding information word and the following information word. This interpolation is obviously only useful if the successive information words are correlated, which is particularly the case in digital recording of a sound signal.

In this process, the transmission or recording format has a sliding structure, i.e. the interlacing of the frames is such that it is impossible to define independent blocks, as was the case in the aforementioned article. This leads to complications during the electronic setting up of sound programs, particularly due to the fact that the sliding structures are broken at the installation point, which leads to a correction capacity loss.

SUMMARY OF THE INVENTION

The object of the present invention is to obviate the disadvantages of known transmission processes. The invention is directed at a process for transmission in the form of independent blocks, so as to be able to bring about easy setting up, particularly of the electronic type.

A further objective of the invention is a transmission process able to avoid an information loss over the entire width of a magnetic tape over a length of approximately 5 to 10 mm, in the case where recording takes place in parallel on several magnetic tracks and also able to avoid the complete loss of a magnetic track when the informations are, e.g. distributed over 4 magnetic tracks.

A further aim of the invention is a transmission process making it possible to correct at least three errors, i.e. a transmission process in which the non-correctable error probability is proportional to $p^4$, when the probability of having an error is equal to p.

The final aim of the invention is to detect and correct errors not detected by the error detecting codes protecting the information and redundancy words.

More specifically, the present invention relates to a process for the transmission in blocks of digital information words, each word having a length of $n_1$ bits, in which $n_1$ is an integer, said process comprising successively adding to the information words to be transmitted words of an error correcting code and words of an error detecting code, wherein the error correcting code is a Hamming code by means of which k redundancy words are added to each sequence of $n_2-k$, $n_2$ being an integer greater than k, consecutive information words, said $n_2-k$ information words, forming with the k redundancy words a set of words called the linked set, each redundancy word having $n_1$ bits and, for each order i, in which $1 \leq i \leq n_1$, the k bits of order i of the redundancy words are redundancy bits of the $n_2-k$ bits of order i of the $n_2-k$ information words, said coding being performed by Hamming matrix, whose column vectors are chosen in such a way as to permit the correction of a given subset of possible errors and the error detecting code is applied to sequences of information words or to sequences of redundancy words, the words of the same sequence belonging to different linked sets, each transmitted block comprising a plurality of sequences of $n_2-k$ information words and the associated error detecting and correcting code words.

The redundancy words are preferably obtained by an extended Hamming code, i.e. of form $(2^m, 2^m-m-1)$, in which m is an integer. However, it is also possible to use a normal Hamming code of form $(2^m-1, 2^m-m-1)$. In both cases, the code can be shortened. It is then respectively of form $(2^m-1, 2^m-m-1-1)$ or of form $(2^m-1-1, 2^m-m-1-1)$. This shortening consists of forcing the value of p bits of each information word to a particular binary value, in general the value "0".

In preferred manner, a transmitted block comprises several interleaved linked sets. The homologous words of each set form a group. These homologous words are distributed in one or several frames, each provided with an error detecting code, e.g. a code word of type CRC. Advantageously to produce the k redundancy bits associated with $n_2-k$ information, use is made of a Hamming matrix with $n_2$ columns and k rows, whereof all the column vectors are of uneven or odd parity.

The Hamming code does not make it possible to correct all the errors, unlike in the generally used Reed-Solomon code. However, it has the advantage, compared with the latter, of simpler decoding, which is important if said decoding has to be carried out in real time. The Hamming matrix is chosen as a function of the errors which it is wished to be able to correct. For the correction of long errors on a monodimensional signal, a Hamming matrix is chosen whereof any sequence of k consecutive column vectors forms a linearly independent system.

For the correction of periodic errors on a monodimensional signal, which corresponds to long errors affecting one track from among P tracks, when the signal is recorded on a tape with P tracks in parallel, in which 1/P is the frequency of the errors in the monodimensional signal, a Hamming matrix is chosen, whereof any sequence of column vectors of index i, $i+P$, $i+2P$, ..., $i+(k-1)P$, in which i is and integer, forms a linearly independent system.

BRIEF DESCRIPTION OF THE DRAWINGS

The invention is described in greater detail hereinafter relative to non-limitative embodiments and the attached drawings, wherein show:

FIGS. 3 and 4, two methods of ranking groups of a block on a four track recording medium.

DETAILED DESCRIPTION OF THE PREFERRED EMBODIMENTS

Figure 1:
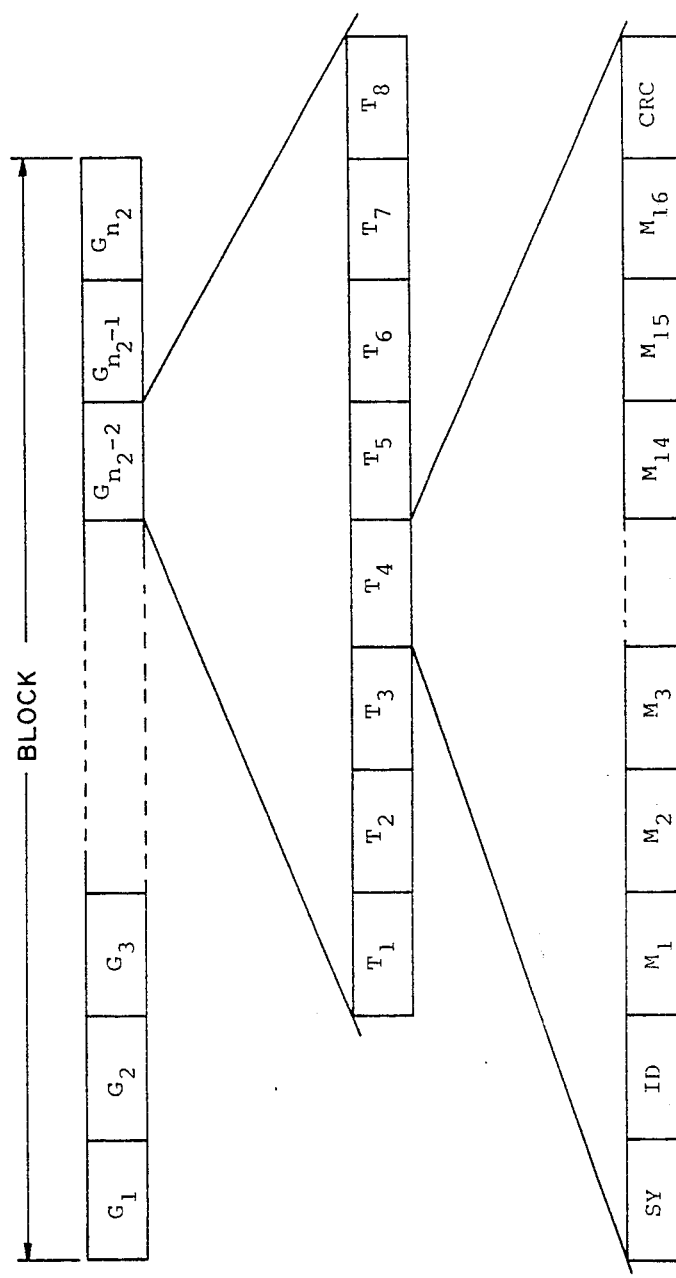
FIG. 1, the format of a transmission block obtained according to the transmission process according to the invention.

With reference to FIG. 1, a description will firstly be given to the structure of a transmission block produced by means of the process according to the invention. A block constitutes an independent entity. It comprises a sequence of $n_2$ groups $G_1$, $G_2$, ... $G_{n_2}$. Each group contains a given number of words, which are either information words, or redundancy words. In order to reduce risks of error, these groups are organized into frames. For example, in the representation of FIG. 1, each group is constituted by a sequence of 8 frames $T_1$, $T_2$, ... $T_8$, each frame comprising a synchronization word SY, an identification word ID noting the number of the frame in the group and the number of the group in the block, a sequence of 16 words $M_1$, $M_2$, ... $M_{16}$ and an error detecting code word (CRC). This identification word can optionally be extended to carry various informations associated with the words $M_1$ to $M_{16}$ of the frame, such as a scale factor.

This block contains 8 linked sets, each formed by a sequence of $n_2-k$ frames of 16 informations words and k frames of 16 redundancy words. The elements (bit, word or frame) of a linked set are distributed at the rate of one element per group, said elements occupying homologous positions in each group. The $n_2-k$ first groups e.g. contain the $n_2-k$ information words of each linked set and the k final groups the associated redundancy words. The number of words per frame, of frames per group and of groups per block are a function of the transmission channel or recording medium used. In the case where transmission takes place by packets, it can be advantageous to bring about correspondence between frame and packet. In the case of recording on a magnetic tape, two main error types can occur, namely long errors due to major mechanical incidents affecting the magnetic tape over a length of approximately 5 to 10 mm and short errors due to dust or a magnetic defect affecting the tape over a length of approximately 1/10 mm.

Preferably, each frame is approximately 1/10 mm long, which avoids the loss of a complete group when a short error occurs. The number of frames per group depends on the desired correction capacities. For example, for $n_2=16$, we have $k=5$ (extended Hamming code (16, 11)) and it is possible to correct long errors extending over 5 consecutive groups, as will be shown hereinafter. In this case, each group must have a length of 1 to 2 mm, which represents about 10 frames per group.

As described in document FR-A-2 467510, it is advantageous in the case of recording information words corresponding to a sound signal to geographically separate the even information words and the uneven information words. This can be carried out within the scope of the inventive process by placing the redundancy frames in the center of the block between even information word frames and uneven information word frames.

Figure 2:
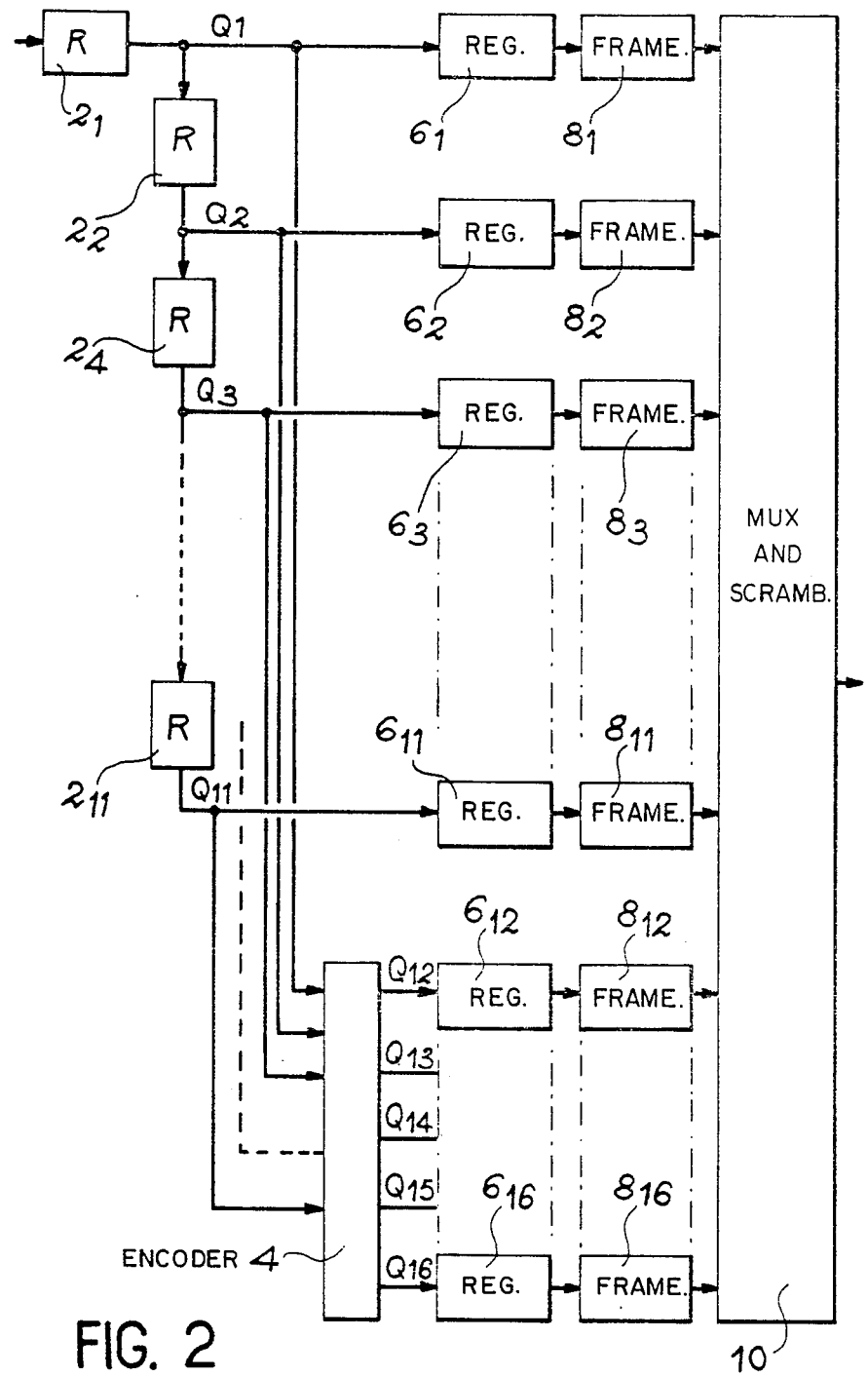
FIG. 2, an embodiment of a coding device for performing the process of the invention.

FIG. 2 shows an embodiment of a transmission device for performing the process according to the invention. This device uses an extending Hamming code (16, 11) for associating 5 redundancy words with each sequence of 11 information words.

This device comprises a set of 11 shift registers $2_1$, $2_2$, ... $2_{11}$ of n bits connected in series, a coding circuit 4 with 11 inputs, each connected to one output of a shift register $2_1$, $2_2$, ... $2_{11}$ and 5 outputs, a set of 16 registers of the first in first out type $6_1$, $6_2$, ... $6_{16}$, the first 11 being connected by the input to one of the shift registers $2_1$, ... $2_{11}$ and the 5 others being connected by the input to one of the 5 outputs of the coding circuit in each case, a set of 16 framing means $8_1$, $8_2$ ... $8_{16}$, each connected to one of the registers $6_1$, $6_2$, ... $6_{16}$ and a multiplexing and scrambling 10.

The device receives sequences of $11 \times N$ bit on the input of shift register $2_1$. These $11 \times N$ bits load the shift registers $2_1$, $2_2$, ... $2_{11}$ with N bits in each case. Preferably, N is a multiple of the length $N_1$ of the information words. Thus, each register contains at the end of loading an integral number of words, e.g. $N=256$ and $n_1=16$.

Following the loading operation, 11 bits are available in parallel, one at the output of each register $2_1$, to $2_{11}$.

These 11 bits are homologous, i.e. of the same rank or order of 11 different information words.

By means of a plurality of EXCLUSIVE-OR gates, coding circuit 4 calculates the five redundancy bits associated by Hamming coding with these 11 information bits. The 5 redundancy bits and 11 information bits form a set of 16 linked bits, which are stored at a rate of one bit per register in register $6_1$ to $6_{16}$.

The Hamming coding of the 11 information bits is represented by a Hamming matrix with 16 columns and 5 rows. This matrix is chosen as a function of the transmission or recording format of the blocks. By choosing a matrix whose column vectors are of uneven parity, it is certain that any triplet of column vectors forms a linearly independent system, which makes it possible in all cases, to correct at least three errors, if the error detecting codes of the frames have detected three erroneous frames.

In the case where the error detecting codes of the frames have all detected erroneous frames, the matrix can be optimized for correcting up to 5 errors relating to the consecutive linked elements (up to k in the general case, where k is the number of redundancy words).

The column vectors of the matrix can also be chosen as a function of the recording format of the block on the recording medium or of the transmission format of the block in the transmission channel. For example, in the case of recording a block on a magnetic tape having P tracks in parallel, it is advantageous to choose the column vectors such that the vectors of index i, i+P, i+2P, etc form a linearly independent system (in which $1 \leq i \leq P$), which makes it possible to ensure the correction of one track from among P tracks, when P is sufficiently large.

In the case of the extended Hamming code (16, 11), which is chosen in an exemplified manner, it is possible to take the following Hamming matrix:

$$H = \begin{bmatrix} 1101011101010000 \\ 1011101100101000 \\ 1111000011100100 \\ 1010111011000010 \\ 1100110110100001 \end{bmatrix}$$

This matrix is such that:
any triplet of column vectors forms a linearly independent system, it being possible to correct any triplet of frames recognized as being erroneous by the error detecting codes of each frame;
any quintuplet of consecutive column vectors forms a linearly independent system, it being possible to correct the loss of 5 consecutive linked frames recognized as being erroneous by error detecting codes of each frame; the column vectors of rank or order (1, 5, 9, 13), (2, 6, 10, 14), (3, 7, 11, 15) or (4, 8, 12, 16) form linearly independent systems, it being possible to correct the loss of one track among 4, if the consecutive linked frames of a block are recorded cyclically on 4 magnetic tracks.

Still referring to FIG. 2, the coding operation is repeated N times for each of the N sets of 11 bits contained in parallel in shift registers $2_1$, to $2_{11}$. Registers $6_1$ to $6_{16}$ then contain N bits in each case.

Each set of N bits is transmitted to a framing means, which supplies to means 10, a frame containing a synchronization word, a frame, N information bits or redundancy identification words and an error detecting code, e.g. a CRC-type code word.

The set of 16 frames supplied by the framing means constitutes a linked set. The multiplexing and scrambling means 10 can form a transmission block by simply multiplexing these frames. The block then comprises a single linked set and each of the 16 groups of the block contains a single frame.

Preferably, means 10 has storage means for storing several linked sets and scrambling or interleaving means for interleaving the frames of linked sets in order to supply a block, whereof each comprises several frames. The object of this interleaving is to geographically separate the frames of the same linked set, so as to limit the probability of losing several frames of the same linked set. These interleaving methods are well known in the art.

The block produced by the device of FIG. 2 and whose structure has been described with reference to FIG. 1 is transmitted on a transmission channel or recorded on a recording medium. The recording medium can comprise one or several tracks in parallel.

In the case where the recording medium comprises a single track, it is identical to a transmission channel. The block is linearly recorded in accordance with the format of FIG. 1.

In the case where the recording medium is a magnetic tape, it generally has several tracks in parallel. Each linked set of the block is then preferably distributed over several magnetic tape tracks.

Figures 3, 4:
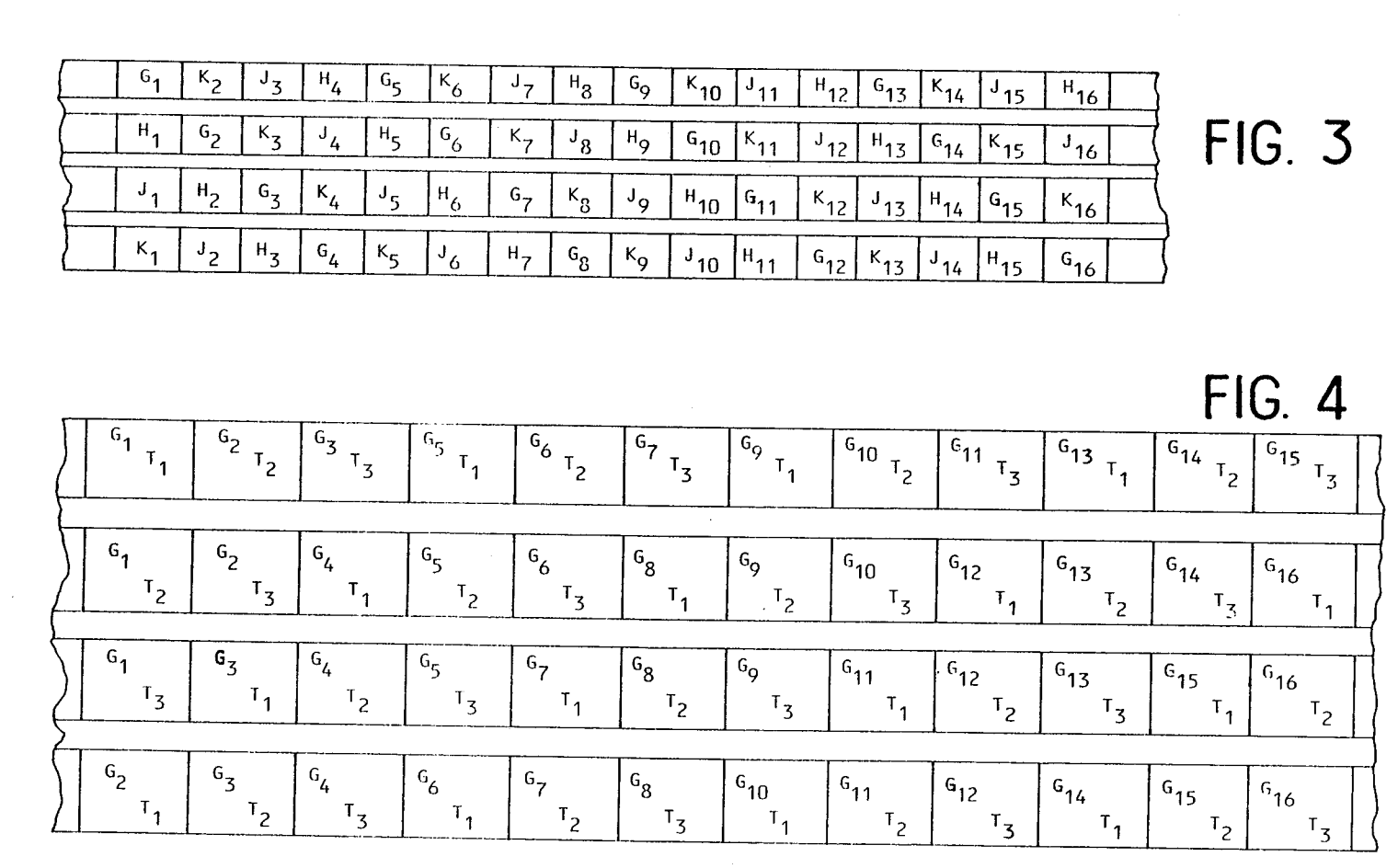

FIG. 3 shows a recording format of four blocks G, H, J, K respectively having the groups $G_1$ to $G_{16}$, $H_1$ to $H_{16}$, $J_1$, to $J_{16}$ and $K_1$ to $K_{16}$. The successive groups of the same block are sequentially arranged in the longitudinal direction of the tape and with a cyclic shift of one track in the transverse direction of the tape.

Thus, for each linked set, formed from 11 information words and 5 redundancy words distributed over the 16 groups of a block, four words appear on each track. These words are linked with independent column vectors if the coding of each block is obtained with the aforementioned matrix H. In this case, the four words of a linked set recorded on the same track can be simultaneously lost without exceeding the error correcting capacity, i.e. these four words can be corrected by the 12 words of the linked set distributed over the three other tracks.

As blocks G, F, J and K are independent, the coding according to the invention makes it possible to correct a track, all of whose informations have been lost. The group of four blocks G, H, J, and K has defined limits on the recording medium. This group itself constitutes a block. The system of independent consecutive blocks on the recording medium is consequently retained, which easily enables the electronic setting up to take place.

The correction property is linked with the fact that the words of a linked set recorded on the same track are associated with vectors linearly independent of the Hamming matrix. This property can be obtained in different ways.

For example, another possibility consists of using a single block, whereof each group is subdivided into a number of frames f which is prime to the number of tracks of the magnetic tape and recording the successive frames in the transverse direction of the tape.

Such a format is shown in FIG. 4 for a block of 16 groups $G_1$ to $G_{16}$, each comprising three frames $T_1$, $T_2$ and $T_3$ recorded on a four track magnetic tape. The 16 words form a linked set and are distributed over the 16 groups at a rate of one word per group, each word occupying a homologous position in each group and being contained in a frame of the same index. With the chosen matrix H, in particular the column vectors of rank 1, 5, 9 and 13 are linearly independent, which, more particularly, makes it possible to correct frames $G_1T_1$, $G_5T_1$, $G_5T_1$, $G_9T_1$ and $G_{13}T_1$ on the basis of the frame $T_1$ of the other groups. More specifically, the chosen matrix and the recording format of FIG. 4 make it possible to completely correct the information of one track on the basis of the three other tracks.

A description will now be given of a strategy for detecting and correcting errors on reading a block. This restoration of the transmitted or recorded information words takes place in three steps:

a valid frame recognition step, which is mainly performed by the error detecting code, a step of calculating syndromes associated with each set of $n_2-k$ linked bits, each bit occupying a homologous position in $n_2-k$ different frames and a step of detecting errors not detected by the information word error detecting and correcting codes as a function of the result of the syndromes.

Figure 5:
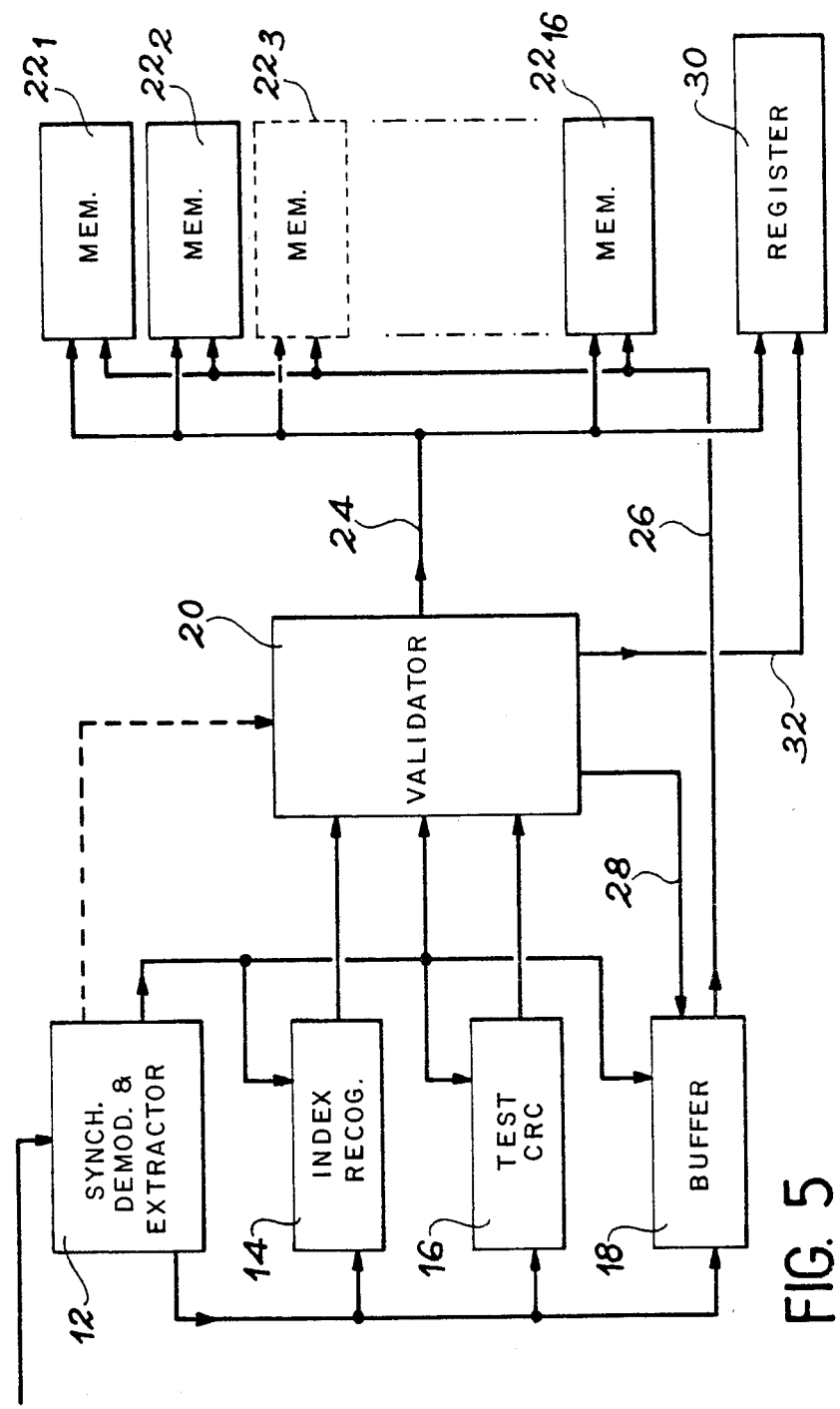
FIG. 5, an embodiment of the recognition stage of the valid frames of the decoding device performing the process according to the invention.
Figure 6:
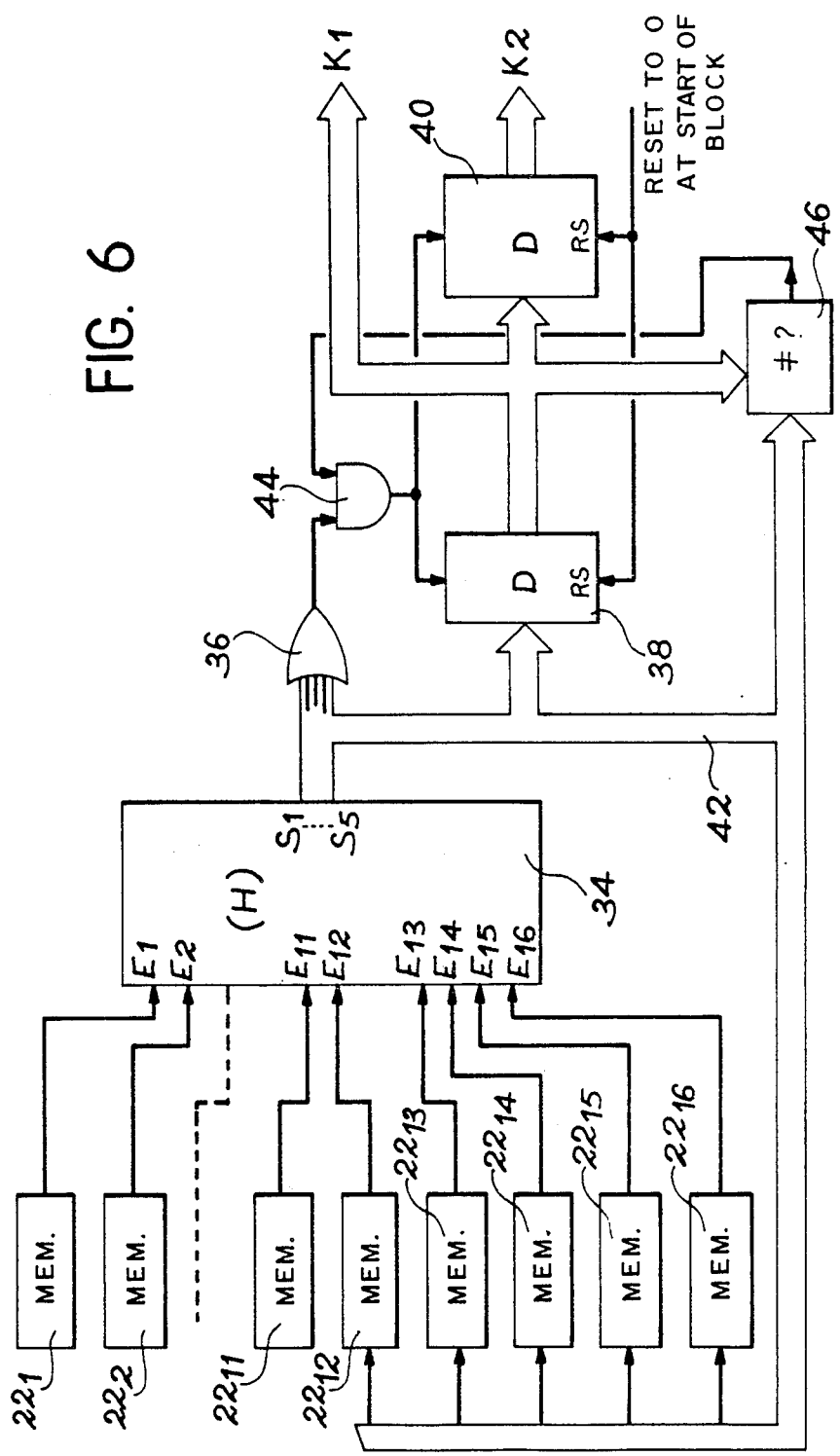
FIG. 6, an embodiment of the stage for calculating the syndrome of the decoding device associated with the process of the invention.
Figure 7:
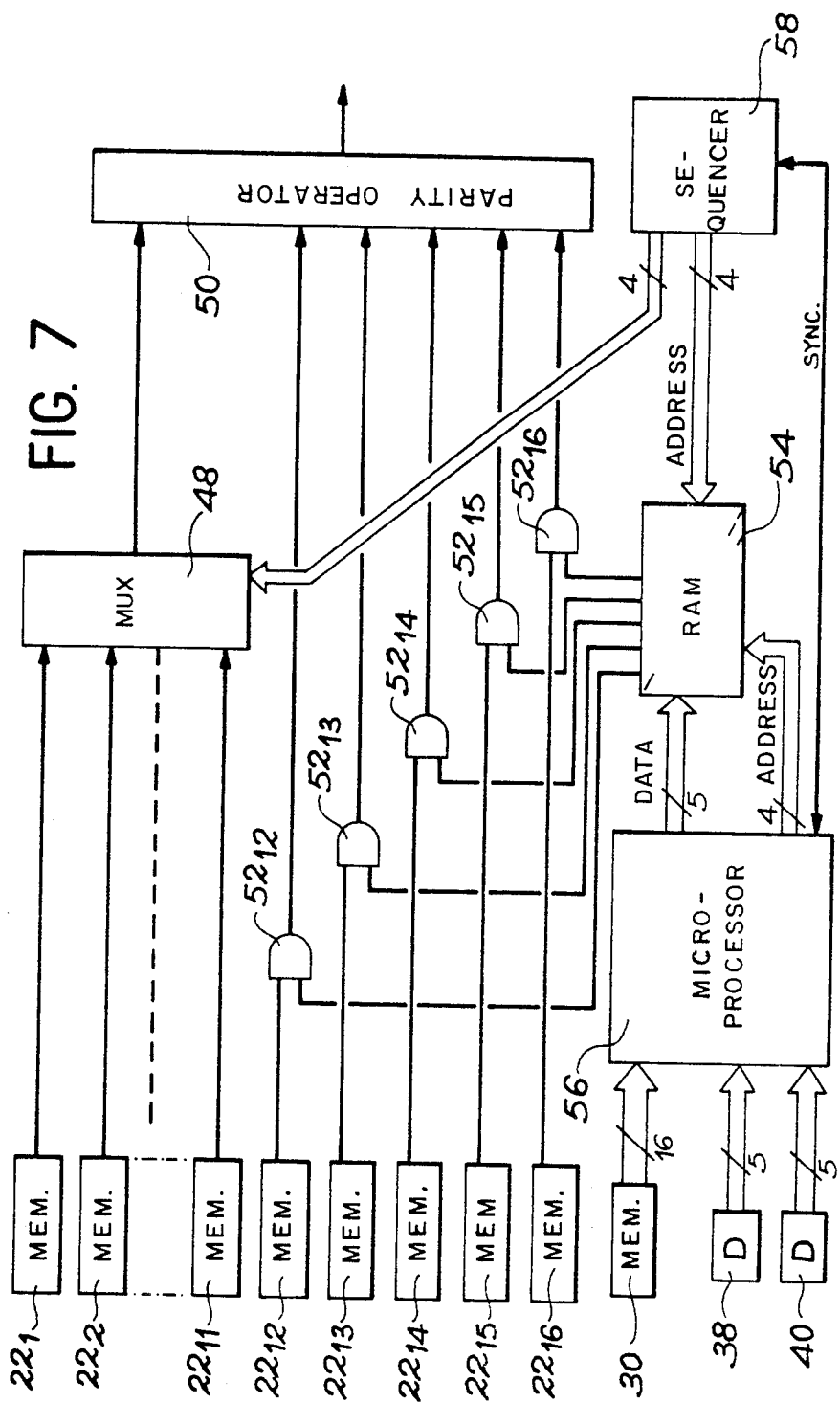
FIG. 7, an embodiment of the error correcting stage of the decoding device associated with the process according to the invention.

These three steps are performed in three circuits constituting a decoding device. An embodiment of each of these circuits is shown in FIGS. 5 to 7. For a better understanding of the invention, a description will now be given of the inventive process successively considering the different possible error cases. This description is provided for an extended Hamming coding (16, 11) defined by the matrix H with the following values:

$$H = \begin{bmatrix} 1101011101010000 \\ 1011101100101000 \\ 1111000011100100 \\ 1010111011000010 \\ 1100110110100001 \end{bmatrix}$$

The decoding process according to the invention makes it possible to correct at least the following errors:

3 errors on 3 random bits of a set of linked bits recognized as being invalid by the error detecting codes of each frame, 5 errors on 5 consecutive linked bits (i.e. associated with 5 consecutive column vectors of matrix H) of a set of linked bits recognized as being invalid by the error detecting codes of each frame, an error on one bit of a linked set, when no bit of the set has been invalidated by the error detecting codes, one error on one bit of a linked set, when only one other of this set has been invalidated by an error detection code.

With the chosen matrix H, this process also makes it possible to correct a large number of configurations in which 4 or 5 random bits (consecutive or non-consecutive) of a linked set have been invalidated by the error detecting codes. The correctable error configuration rates are respectively 93% and 66% of the cases for 4 and 5 errors.

The designations $a_1, a_2 \ldots a_{11}$ are given to the linked bits or homologous bits of the information words of a linked set. Assuming that the transmitted values $a_3, a_4, a_5, a_6$ and $a_7$ have not been validated by the frame error detecting codes, i.e. they are liable to be erroneous and designating by $a'_3, a'_4, a'_5, a'_6$ and $a'_7$ the values received and $e_3, e_4, e_5, e_6$ and $e_7$ the error vector, we obtain:

$$\begin{pmatrix} a'_3 \\ a'_4 \\ a'_5 \\ a'_6 \\ a'_7 \end{pmatrix} = \begin{pmatrix} a_3 \\ a_4 \\ a_5 \\ a_6 \\ a_7 \end{pmatrix} + \begin{pmatrix} e_3 \\ e_4 \\ e_5 \\ e_6 \\ e_7 \end{pmatrix}$$

Considering the matrix $H'$ formed from the column vectors of orders 3, 4, 5, 6 and 7 of the matrix H:

$$H' = \begin{pmatrix} 01011 \\ 11101 \\ 11000 \\ 10111 \\ 00110 \end{pmatrix}$$

we obtain the relation:

$$H' \cdot \begin{pmatrix} e_3 \\ e_4 \\ e_5 \\ e_6 \\ e_7 \end{pmatrix} = \begin{pmatrix} s_1 \\ s_2 \\ s_3 \\ s_4 \\ s_5 \end{pmatrix}$$

in which $(s_1, s_2, s_3, s_4, s_5)$ is the syndrome defined by $$H \cdot \begin{pmatrix} a'_1 \\ a'_2 \\ a'_3 \\ a'_4 \\ \cdot \\ \cdot \\ a'_{16} \end{pmatrix} = \begin{pmatrix} s_1 \\ s_2 \\ s_3 \\ s_4 \\ s_5 \end{pmatrix}$$

from this is deduced:

$$\begin{pmatrix} a_3 \\ a_4 \\ a_5 \\ a_6 \\ a_7 \end{pmatrix} = \begin{pmatrix} a'_3 \\ a'_4 \\ a'_5 \\ a'_6 \\ a'_7 \end{pmatrix} + (H')^{-1} \cdot \begin{pmatrix} s_1 \\ s_2 \\ s_3 \\ s_4 \\ s_5 \end{pmatrix}$$

the correction of the vector received $(a'_3, a'_4, a'_5, a'_6, a'_7)$ to obtain the vector transmit $(a_3, a_4, a_5, a_6, a_7)$ consequently amounts to the calculation of the inverse or reverse of matrix $H'$. This inverse or reverse matrix only exists if the column vectors of H are linearly independent. In the chosen example, matrix $H'$ is reversible and we obtain:

$$H'^{-1} = \begin{pmatrix} 11001 \\ 11101 \\ 10110 \\ 10111 \\ 11010 \end{pmatrix}$$

It is therefore possible to correct the five detected errors contained in the vector received. The correction capacity stops there and it is not possible to correct errors not detected by the frame error detecting codes.

When matrix H' is not reversible, the missing bits can be estimated by known masking methods, such as by interpolation between consecutive information words.

In the case where 4 bits of a linked set have not been validated by the frame error detecting code, correction takes place substantially in the same way as in the previous case.

Assuming that the bits of order 8, 9, 10 and 11 are invalidated, matrix H' is considered to be formed from columns of order 8, 9, 10 and 11 of matrix H, i.e.

$$H' = \begin{pmatrix} 1010 \\ 1001 \\ 0111 \\ 0110 \\ 1101 \end{pmatrix}$$

and we obtain:

$$H' \cdot \begin{pmatrix} e_8 \\ e_9 \\ e_{10} \\ e_{11} \end{pmatrix} = \begin{pmatrix} s_1 \\ s_2 \\ s_3 \\ s_4 \\ s_5 \end{pmatrix}$$

H" is sought such that:

$$\begin{pmatrix} 1000 \\ 0100 \\ 0010 \\ 0001 \\ 0000 \end{pmatrix} \cdot \begin{pmatrix} e_8 \\ e_9 \\ e_{10} \\ e_{11} \end{pmatrix} = H'' \cdot \begin{pmatrix} 1 \\ 2 \\ 3 \\ 4 \\ 5 \end{pmatrix}$$

the calculation gives:

$$H'' = \begin{pmatrix} 01110 \\ 11100 \\ 11110 \\ 00110 \\ 10101 \end{pmatrix}$$

The final equation of the system, i.e. $0 = s_1 + s_3 + s_5$ is a compatibility equation. When this compatibility equation is not proved, it is because the frame error detecting codes have not detected all the errors. In this case, it is not possible to correct the words received. The erroneous bits can then be estimated by masking methods, which are also used when the matrix H" does not exist.

The case where 3, 2 or 1 bits of a linked set are invalidated is dealt with in the same way as the case where 4 bits of a linked set are invalidated, the only difference being that for 3, 2 or 1 bits there are respectively 2, 3 and 4 compatibility equations which must be satisfied.

The process according to the invention also makes it possible to correct an error not detected by the error detecting codes in a set of linked bits, when no error has been detected by these frame error detecting codes. This situation occurs when all the bits of a linked set are validated and the associated syndrome is not zero.

The location of the error in the bits of a linked set is determined by the value of the syndrome. If there is only one undetected error, which the most probable case, the syndrome is equal to the column vector of the matrix H, whose order is the same as that of the erroneous bit.

Finally, the process according to the invention makes it possible to correct an error not detected by the frame error detecting codes when one bit of the set of linked bits has been invalidated.

Two cases occur as a function of whether the non-validated but is true or false. These cases are distinguished by the parity of the syndrome. If the number of bits at "1" of the syndrome is uneven, the non-validated bit is true and the syndrome is equal to the column vector of the matrix H, whose order is identical to that of the undetected erroneous bit. If the number of bits at "1" of the syndrome is even, the non-validated bit is false and the syndrome is equal to the sum of the column vectors associated with the non-validated bit and with the undetected erroneous bit. For example, if the syndrome is (1, 1, 0, 0, 0) and if the bit of order 2 is non-validated and erroneous, the column vector of the matrix H associated with the undetected erroneous bit is $$\begin{pmatrix} 1 \\ 1 \\ 0 \\ 0 \\ 0 \end{pmatrix} + \begin{pmatrix} 1 \\ 0 \\ 1 \\ 0 \\ 1 \end{pmatrix} = \begin{pmatrix} 0 \\ 1 \\ 1 \\ 0 \\ 1 \end{pmatrix}$$

Thus, the undetected erroneous bit is that of order 11.

A description will now be given of an embodiment of the decoding device for performing the decoding process according to the invention. This device comprises 3 circuits respectively shown in FIGS. 5 to 7.

The circuit of FIG. 5 recognizes the valid frames in the frames received and has a conventional structure. It comprises at the input a synchronization demodulation and extraction means 12 successively receiving the different frames of a block. The demodulation operation makes it possible to detect the frame synchronization word in the case where this is transmitted by code violation. Such a method is of particular interest in the case of a long interruption of the signal received, as is the case when a fault affects a magnetic tape, because it permits a very fast resynchronization of means 12 on the frames received.

Means 12 supplies the frame identification word to an index recognition means 14, the informations necessary for the detection of frame errors to a test means 16 and the end bits of information or redundancy words to a buffer 18. The entry of the data into means 14, 16 and buffer 18 is timed by clock signals produced in known manner by means 12.

The useful information bits of the frame are validated by a validation means 20 if the identification word is recognized by means 14 and if the error detecting code indicates the absence of errors. The validation means can also decide on the invalidation of a frame, as a function of other informations which can be supplied by means 12, such as an abnormal frame length or a code violation for useful information bits.

In this circuit, the frame is considered as an indivisible entity with respect to its validity. If the frame error detecting code detects an error, the frame is considered to be invalid and all the bits of this frame are marked.

According to a constructional variant, the error detecting code only invalidates the frame bits considered to be erroneous. The detecting and correcting processing of the errors by means of redundancy words is, then, a bit-by-bit processing, i.e. it affects the sets of $n_2$ bits, $n_2 - k$ being information and k redundancy extracted from $n_2$ linked frames and said processing is repeated for each set of $n_2$ bits occupying a given order in said frames.

It was stated hereinbefore that said processing particularly comprises a matrix inversion or reversal stage. It is clear that the bit-by-bit processing of a frame can take a long time and it is consequently generally preferable to simultaneously validate or invalidate all the bits of the frame. Thus, the same matrix is used for each set of $n_2$ bits. In this case, then, there is only a single reverse matrix calculation per set of linked frames. This leads to a much higher processing speed. Moreover, it should be noted that this processing by frames is adapted to the error probability on the recording medium because, as stated hereinbefore, the frame is made of the same order of magnitude as the short error (approximately 1/10 mm) on the recording medium.

Returning now to FIG. 5, when a frame is validated, it is stored in one of the 16 memories $22_1 \ldots 22_{16}$, which are shown separately for a better understanding, but in practice they are zones of the same working memory. These memories are addressed by an address bus 24 using validation means 20. A data line 26 connects the data output of buffer 18 to the inputs of memories $22_1$ to $22_{16}$. The transmission of data in series on this data line is controlled by a connection 28 connecting the validation means 20 to buffer 18. The addressing of memories $22_1$ to $22_{16}$ takes place in such a way as to store the linked frames in the same order as in the framing means of the transmission device of FIG. 2.

Finally, the circuit of FIG. 5 comprises a register 30 connected to address bus 24 and which is emptied before the circuit receives a block. This is carried out by the validation means 20 by a control signal transmitted on a connection 32. Finally, for each frame received, validation means 20 transmits to register 30 a data item for marking the valid frames received.

The content of the memories associated with the not valid frames is unimportant for the correction, provided that the correction capacities are not exceeded. Beyond this, the loading strategy of the memories is linked with the masking methods possibly applied to the transmitted information. In the case of transmission by packet, an erroneous or lost packet is considered to be an invalid frame.

The circuit shown in FIG. 5 corresponds to the case where the signal received comes from a single transmission channel or a recording medium with a single track. For example, in the case of a recording medium with several tracks, it is necessary to provide a system constituted by means 12, 14, 16, 18 and 20 for each track.

Memories $22_1$ to $22_{16}$ are accessed in writing by the frame recognition circuit of FIG. 5. They are also accessed in reading by the syndrome calculating circuit of FIG. 6. Several known solutions exist for obtaining this double access. A first solution consists of providing two sets of memories $22_1$ to $22_{16}$ and two registers 30, one set being accessible in reading and the other in writing during the reception of one block, the role of the two sets being interchanged following each block. Another solution consists of using memories with several ports organized in page form, each page being allocated to the frames of one block. This solution also makes it possible to effect the de-interleaving function when the linked frames are interleaved with other frames, as is the case in the format of FIG. 1.

The circuit shown in FIG. 6 calculates the syndromes associated with the sets of 16 linked bits received. It compares these syndromes with zero and is able to store two different non-zero syndromes. The possibility of storing two different syndromes does not cover all cases. This particular value of two storable syndromes is chosen here, because it is adequate for detecting an error not detected by the frame error detecting codes and because the probability of having two errors not detected by the error detecting codes is very improbable.

In the circuit of FIG. 6 are reproduced the memories $22_1$ to $22_{16}$, whose access is shared with the valid frame recognition circuit of FIG. 5. Each memory comprises a single data output connected to an input of a syndrome calculating means 34 having 16 inputs $E_1, E_2 \ldots E_{16}$. This means supplies on 5 outputs $S_1, S_2, S_3, S_4$ and $S_5$ the syndrome defined by the product between the Hamming matrix H and the vector of the 16 linked bits received.

An OR gate 36, whose inputs are connected to the outputs of means 34 makes it possible to detect whether the syndrome is zero. The circuit also comprises two D-type flip-flops 38, 40 in series, each flip-flop containing 5 bits, flip-flop 38 being connected to the output of means 34 by a data bus 42. The two flip-flops are simultaneously loaded by the output signal of an AND gate 44, whereof one input is connected to the output of the OR gate 36 and whereof the other input is connected to the output of a comparison means 46, which supplies a high level signal when the syndromes supplied by means 34 and flip-flop 38 differ.

This system, in which the flip-flops are initialized to zero at the start of the block, makes it possible to store the first non-zero syndrome of a block in flip-flop 38 and, when a second non-zero syndrome is detected, to shift the first syndrome from flip-flop 38 to flip-flop 40 and to store the second syndrome in flip-flop 38. If a third non-zero syndrome is detected, there is a further shift of the content of flip-flops 40 and the first syndrome is lost. In general terms, flip-flops 38, 40 store the last two non-zero syndromes of a frame.

All the calculated syndromes, no matter whether they are zero or non-zero, are reintroduced into memories $22_{12}$ to $22_{16}$ by replacing the corresponding redundancy bits, which is carried out by means of data bus 42, whereof each data line is connected to a data input of memories $22_{12}$ to $22_{16}$.

At the end of calculating the syndromes of a set of linked words, three cases can occur:

all the syndromes are zero and flip-flops 38 and 40 contain zero values, a single syndrome is not zero and is contained in flip-flop 38, at least two different syndromes are non-zero and two of them are contained in flip-flops 38 and 40.

As stated hereinbefore, the value of the syndrome associated with a set of linked bits and the validity state of the frames, each containing one of these linked bits makes it possible to correct the set of linked bits received in order to find again the set of linked bits transmitted. This correction is realised in the correction circuit, an exemplified embodiment of which is given in FIG. 7. The latter shows memories $22_1$ to $22_{16}$, register 30 and flip-flops 38 and 40, which respectively contain sets of linked frames, frame validation bits and, if appropriate, non-zero syndromes.

The circuit shown in FIG. 7 comprises a multiplexer 48, whose inputs are connected to the output of memories $22_1$ to $22_{11}$ containing information bits. The output of this multiplexer is connected to one input of a parity operator 50 of the EXCLUSIVE-OR type. For each memory $22_{12}$ to $22_{16}$ containing the bits of the syndrome, the data output is connected to the input of an AND gate $52_{12}$ to $52_{16}$, whereof the output is applied to an input of the parity operator 50. The second input of each AND gate is supplied by one bit of a mask of 5 bits contained in a random-access memory (RAM) 54.

The circuit also comprises a calculating means, such as a microprocessor 56, for calculating said mask as a function of the content of register 30 and flip-flops 38, 40. Microprocessor 56 is synchronized with a sequencer 58, which ensures the selection of data at the input of multiplexer 48 and in the RAM 54.

The processing performed by microprocessor 56 relates to a complete set of linked frames and comprises two successive stages. These consist of seeking erroneous frames not detected by the frame error detecting codes and calculating correction coefficients forming the mask applied to the second inputs of AND gates $52_{12}$ to $52_{16}$.

In a first stage, the microprocessor reads the content of register 30 to determine the number of invalid frames detected, i.e. the number of invalidated linked bits among the 16 bits of a linked set. If this number of invalid frames exceeds 5 (number of redundancy bits), the correction is impossible and the 11 information bits of the set of linked bits are estimated by masking methods.

In the case where the number of frames declared to be invalid by register 30 is equal to 0 or 1, the microprocessor examines the syndromes $K_1$ and $K_2$ contained in flip-flops 38 and 40 for detecting a possible false frame, which has not been invalidated by its error detecting code.

The observation of the syndromes K1 and K2 makes it possible to detect, in certain cases, false frames not invalidated by the error detecting codes. This eventuality is not very probably and is not taken into account here.

If no error has been detected by the error detecting codes, there are three possible cases:

(a) the syndromes $K_1$ and $K_2$ are zero and as no frame is erroneous, microprocessor 56 writes into the RAM 54 for each frame a mask constituted by 5 "0". This mask is applied to the inputs of the AND gates $52_{12}$ to $52_{16}$. The parity operator 50 is transparent for the series words delivered by the multiplexer 48.

(b) Syndrome $K_1$ has an uneven number of "1" and syndrome $K_2$ is zero. There is then an invalid frame not detected by its error detecting code. This frame is associated with the column vector equal to the syndrome $K_1$.

(c) Syndrome $K_1$ has an even number of "1" or syndrome $K_2$ is not zero. There is then more than 1 invalid frame not detected by the error detecting codes and correction is not carried out (this case is very unlikely).

Consideration will now be given to the case where an error has been detected by an error detecting code, where four cases occur:

(a) The syndromes $K_1$ and $K_2$ are zero. It is then considered that the error detected by the error detecting code relates to the bits of the frame, other than the linked bits, e.g. the bits of the error detecting code.

(b) Syndrome $K_1$ has an uneven number of "1" and syndrome $K_2$ is zero. If syndrome $K_1$ corresponds to the frame already detected by the error detecting code, i.e. if syndrome $K_1$ is equal to the column vector of the Hamming matrix, whose order is the same as that of the invalid frame in the set of linked frames, there is no supplementary error. However, if the syndrome $K_1$ corresponds to another frame, it is considered that this other frame is invalid.

(c) The syndromes $K_1$ and $K_2$ are not zero.

(c1) If the syndromes are uneven, they correspond to two different invalid frames. Correction is only carried out if one of these two invalid frames is that detected by the error detecting code.

(c2) If the syndromes have a different parity, the syndrome having an uneven number of "1" results from an error on the associated frame, i.e. whose order corresponds to the column vector of the matrix equal to the syndrome and the syndrome having an even number of "1" results from an error on two different frames. The second invalid frame is associated with the column vector equal to $K_1 + K_2$. Correction only takes place if one of the two frames found to be invalid by syndromes $K_1$ and $K_2$ is equal to the detected frame invalidated by the error detecting code.

(d) In other cases, there is more than one error not detected by the error detecting codes and the correction is not carried out. It should be noted that this is a special strategy, which is linked with the fact that the probability of two errors not being detected by the error detecting codes is very small. However, from the mathematical standpoint only, the correction remains possible, in this case, in a certain number of error configurations.

Thus, the observation of the syndromes $K_1$ and $K_2$ makes it possible to modify, if necessary, the content of the register 30 carrying the validity state of each frame.

For microprocessor 56, the following stage consists of forming the matrix H' with c ($c \leq 5$) columns and 5 rows formed by the c column vectors associated with the c invalidated frames classified by increasing rank or order. This matrix H' is transformed in a conventional manner, e.g. by triangulation, to produce a matrix $H'^{-1}$ with 5 columns and 5 rows.

If this operation is not possible, which may occur when there are 4 or 5 errors, the correction is not made. In the case where the operation is possible, a relation is obtained which links the errors of the c erroneous frames with the 5 frames of syndromes. This relation is expressed, for each frame, by a set of 5 binary correction coefficients constituting one row of the matrix $H'^{-1}$ or $H''$. The correction coefficients are equal to "0" for the validated frames.

Sequencer 58 simultaneously controls the multiplexer 48 and the RAM 54 for supplying the parity operator 50 with one bit of a frame and the associated correction word, said word being equal to the syndrome multiplied by the mask formed by the 5 binary correction coefficients.

What is claimed is:

1. A process for the transmission in blocks of digital information words, each word having a length of $n_1$ bits, in which $n_1$ is an integer, said process comprising successively adding to the information words to be transmitted words of an error correcting code and words of an error detecting code, wherein the error correcting code is a Hamming code by means of which k redundancy words are added to each sequence of $n_2-k$, $n_2$ being an integer greater than k, consecutive informtion words, said $n_2-k$ information words forming with the K redundancy words a set of words called the linked set, each redundancy word having $n_1$ bits and, for each order i, in which $1 \leq i \leq n$, the k bits of order i of the redundancy words are redundancy bits of the $n_2-k$ bits of order i of the $n_2-k$ information words, said coding being performed by Hamming matrix, whose column vectors are chosen in such a way as to permit the correction of a given subset of possible errors and the error detecting code is applied to sequences of information words or to sequences of redundancy words, the words of a same sequence belonging to different linked sets, each transmitted block comprising a plurality of sequences of $n_2-k$ information words and the associated error detecting and correcting code words.

2. A process according to claim 1, wherein an extended Hamming code is used.

3. A process according to claim 1, wherein, for producing the k redundancy bits associated with the $n_2-k$ information bits, use is made of a Hamming matrix with $n_2$ and k rows, whereof all the column vectors are of uneven parity.

4. A process according to claim 1, wherein, for producing the k redundancy bits associated with $n_2-k$ information bits, use is made of a Hamming matrix with $n_2$ columns and k rows, whereof any sequence of k consecutive column vectors forms a linearly independent system.

5. A process according to claim 1, wherein for producing the k redundancy bits associated with $n_2-k$ information bits, use is made of a Hamming matrix with $n_2$ columns and k rows, whereof any sequence of k vectors of indexes i, i+P, i+2P, ..., i+(k−1)P, in which i,P are integers and $i+(k-1)P \leq n_2$, forms a linearly independent system.

6. A process according to claim 5 for recording a block on an information medium comprising P parallel recording tracks, wherein the $n_2$ words of a linked set are distributed over the P tracks, so that the words recorded on the same track are associated with column vectors of the Hamming matrix forming a linearly independent system.

7. A process according to claim 1, wherein, after associating k redundancy words with $n_2-k$ information words for forming a set of linked words, the words of $n_3$ linked sets are interlaced to form a transmission block constituted by $n_2$, each group containing one word of each linked set and at least one error detecting code.

8. A process according to claim 7, wherein the block contains even information words and uneven information words and the groups containing redundancy words are placed in the center of the block, between the groups containing the even information words and the groups containing the uneven information words.

9. A process according to claim 8, wherein each word of a linked set is contained in a frame, each frame comprising a synchronization word, at least one information or redundancy word and an error detecting code.

10. A process according to claim 9 for recording a block on an information medium comprising P parallel tracks, each group of said block comprising f frames, in which f is prime to the number of tracks P, wherein the $n_2$ words of a linked set are distributed over P tracks, so that the words recorded on the same track are associated with column vectors of the Hamming matrix forming a linearly independent system and wherein the block is recorded frame by frame, the frames of each set of P consecutive frames of the block being placed in parallel on the P tracks.

11. A process according to claim 1, wherein additionally, on reception, determination takes place of the validity of each information or redundancy bit linked with the error detecting codes associated with the information or redundancy words and for each set of $n_2$ linked bits, the syndrome associated with said set is calculated and from said syndrome and the validity informations relative to each bit is calculated an error vector related to the Hamming code used and each vector of $n_2-k$ bits received is corrected by said error vector.

12. A process according according to claim 11, wherein, for calculating the error vector of a vector of $n_2-k$ linked bits, a reduced matrix (H') constituted by the column vectors of the Hamming matrix (H) used on transmission is defined and whereof the orders are equal to those of the linked bits invalidated by the error detecting codes and from this is deduced another matrix ($H'^{-1}$, $H''$), such that the product of said other matrix by the syndrome is equal to the error vector.

13. A process according to claim 11, wherein, for each set of linked bits, use is made of the syndrome, when it is not zero, for detecting the erroneous bits not invalidated by the error detecting codes.

14. A process according to claim 11, in which the information and redundancy words are transmitted in frames, wherein detection takes place of the validity of a received frame relative to its error detecting code and wherein for each set of linked frames definition takes place of a reduced matrix (H'') constituted by the column vectors of the Hamming matrix (H) used on transmission and whereof the orders are equal to those of the linked frames invalidated by the error detecting codes and deduction takes place of another single matrix ($H'^{-1}$, $H''$) for each set of linked frames, so that the product of this other matrix by a non-zero syndrome is equal to the error vector.

15. A process according to claim 14, wherein at least certain non-zero syndromes associated with sets of linked bits of linked frames are stored and wherein said non-zero syndromes are used for detecting erroneous frames not invalidated by the error detecting codes.

* * * * *